US011283007B2

(12) United States Patent
Kuo et al.

(10) Patent No.: US 11,283,007 B2
(45) Date of Patent: Mar. 22, 2022

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chih-Wei Kuo, Tainan (TW); Meng-Jun Wang, Taichung (TW); Yi-Wei Tseng, New Taipei (TW); Yu-Tsung Lai, Tainan (TW); Jiunn-Hsiung Liao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/064,614

(22) Filed: Oct. 7, 2020

(65) Prior Publication Data
US 2021/0028352 A1    Jan. 28, 2021

Related U.S. Application Data

(63) Continuation of application No. 16/439,712, filed on Jun. 13, 2019, now Pat. No. 10,847,709.

(30) Foreign Application Priority Data
May 20, 2019    (CN) .......................... 201910419208.X

(51) Int. Cl.
*H01L 27/22* (2006.01)
*H01L 43/02* (2006.01)
*H01L 43/12* (2006.01)

(52) U.S. Cl.
CPC .............. *H01L 43/02* (2013.01); *H01L 43/12* (2013.01); *H01L 27/222* (2013.01)

(58) Field of Classification Search
None
See application file for complete search history.

(56) References Cited

U.S. PATENT DOCUMENTS

| | | | |
|---|---|---|---|
| 6,638,871 B2 | 10/2003 | Wang et al. | |
| 6,720,249 B1 | 4/2004 | Dalton et al. | |
| 10,388,862 B1 | 8/2019 | Yang | |
| 11,101,429 B2* | 8/2021 | Peng | H01L 27/222 |
| 2002/0018849 A1 | 2/2002 | George | |
| 2016/0020249 A1 | 1/2016 | Ko | |
| 2017/0107460 A1 | 4/2017 | Liu | |
| 2020/0075669 A1 | 3/2020 | Chuang | |

* cited by examiner

*Primary Examiner* — Hsien Ming Lee
(74) *Attorney, Agent, or Firm* — Winston Hsu

(57) ABSTRACT

A method for fabricating semiconductor device includes the steps of: forming a magnetic tunneling junction (MTJ) on a substrate; forming a first inter-metal dielectric (IMD) layer around the MTJ; forming an etch stop layer on the first IMD layer; forming a second IMD layer on the etch stop layer; forming a patterned hard mask on the second IMD layer; performing a first etching process to form a contact hole in the second IMD layer for exposing the etch stop layer; performing a second etching process to remove the patterned hard mask; performing a third etching process to remove the etch stop layer and the first IMD layer for exposing the MTJ; and forming a metal interconnection in the contact hole.

11 Claims, 10 Drawing Sheets

SEMICONDUCTOR DEVICE AND METHOD FOR FABRICATING THE SAME

CROSS REFERENCE TO RELATED APPLICATIONS

This is a continuation application of U.S. patent application Ser. No. 16/439,712, filed on Jun. 13, 2019, and all benefits of such earlier application are hereby claimed for this new continuation application.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a magnetic tunneling junction (MTJ) on a substrate; forming a first inter-metal dielectric (IMD) layer around the MTJ; forming an etch stop layer on the first IMD layer; forming a second IMD layer on the etch stop layer; forming a patterned hard mask on the second IMD layer; performing a first etching process to form a contact hole in the second IMD layer for exposing the etch stop layer; performing a second etching process to remove the patterned hard mask; performing a third etching process to remove the etch stop layer and the first IMD layer for exposing the MTJ; and forming a metal interconnection in the contact hole.

According to another aspect of the present invention, a semiconductor device includes: a magnetic tunneling junction (MTJ) on a substrate; a first inter-metal dielectric (IMD) layer around the MTJ; a metal interconnection on and directly contacting the MTJ; a second IMD layer on the first IMD layer and around the metal interconnection; and a metal oxide layer on the second IMD layer and around the metal interconnection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
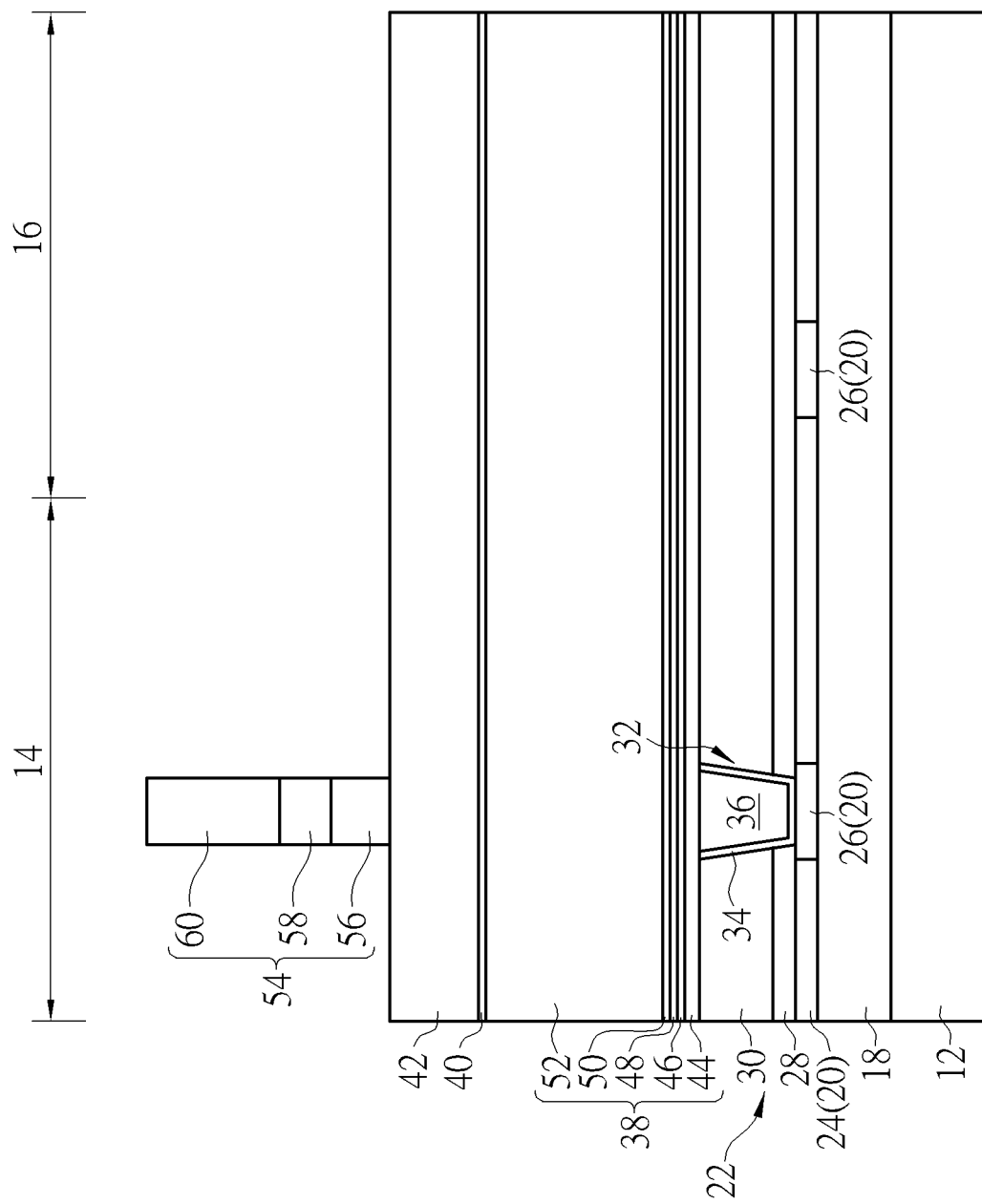
FIGS. 1-9 illustrate a method for fabricating a MRAM device according to an embodiment of the present invention.
Figure 2:
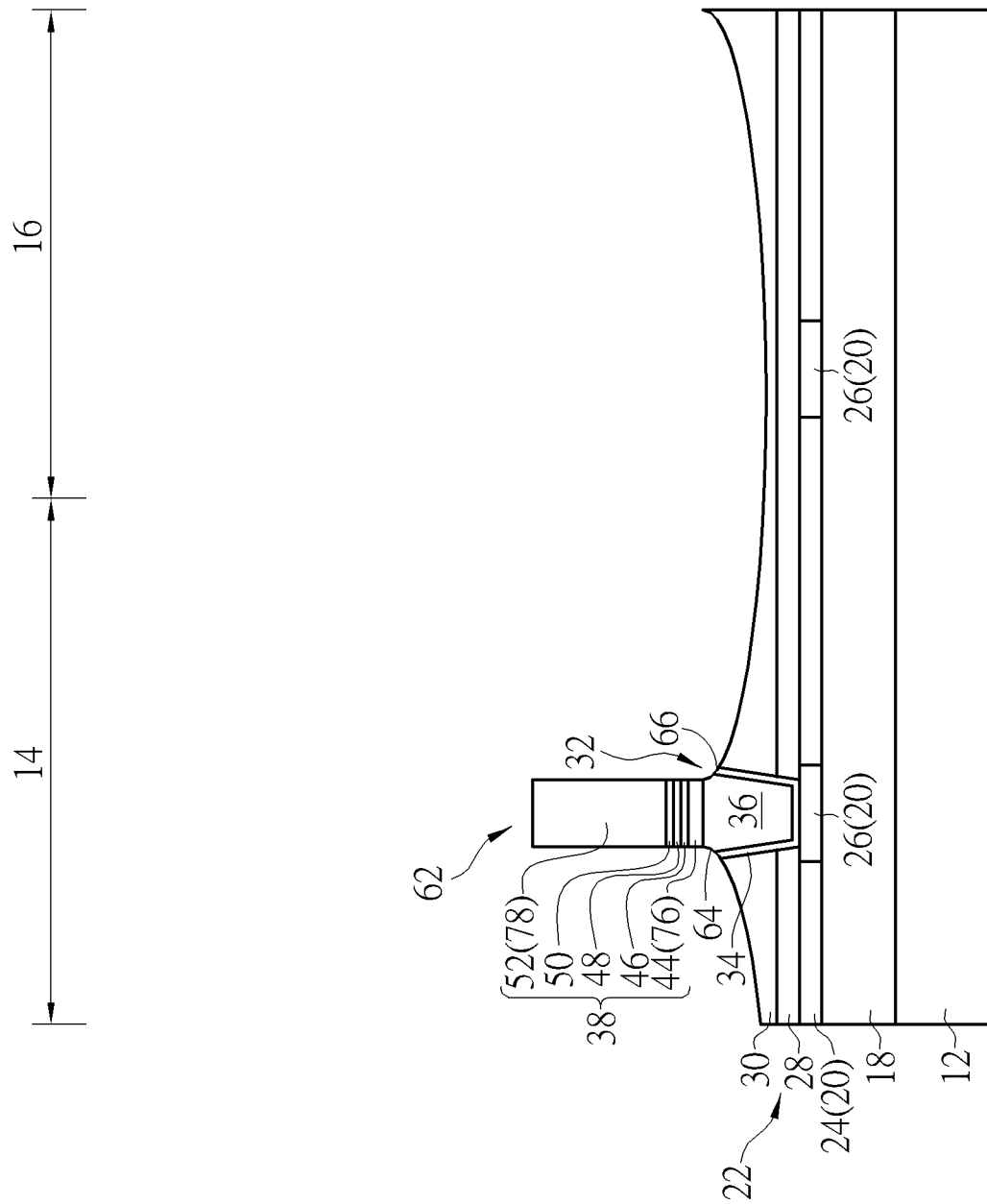
Figure 3:
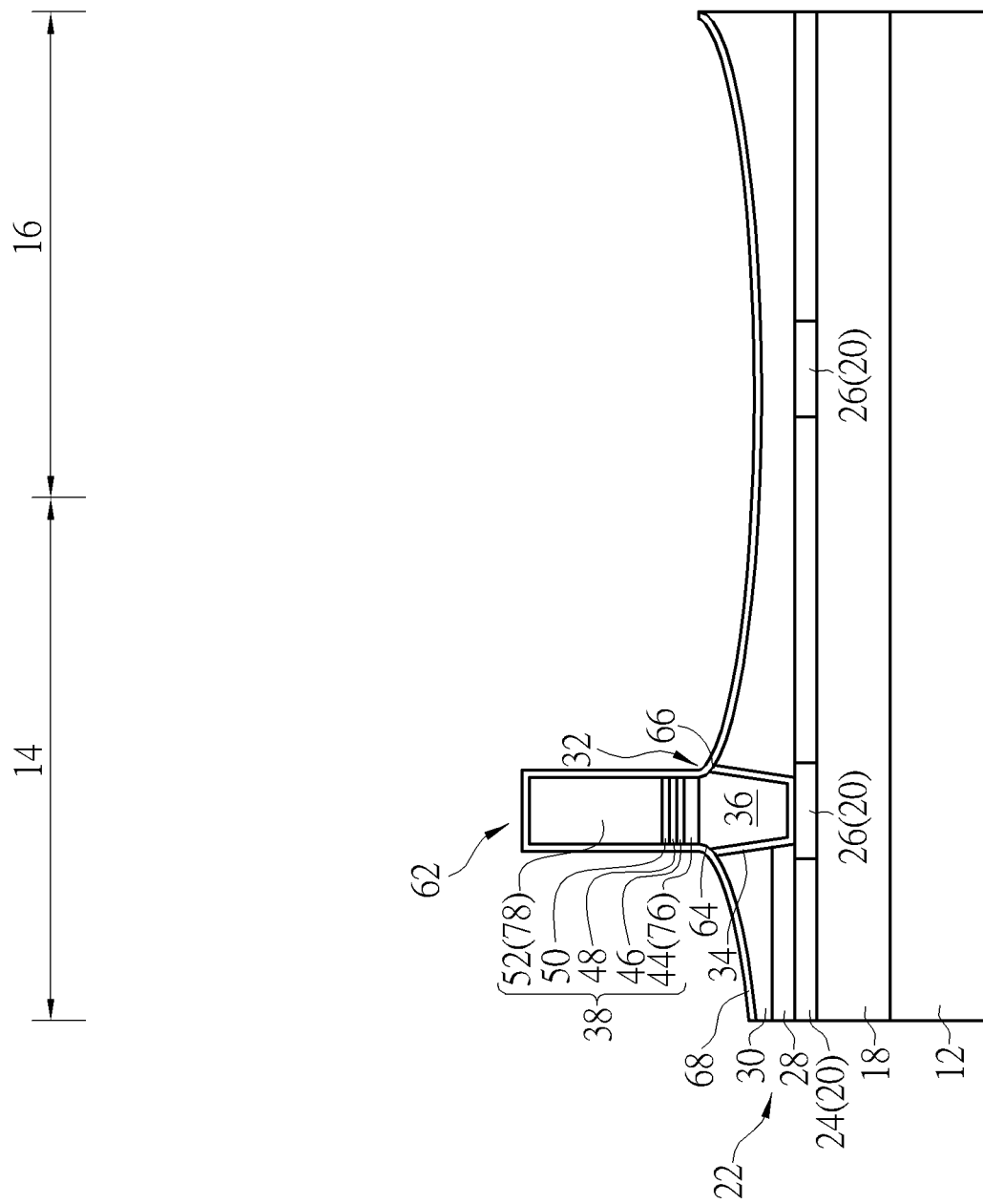

Referring to FIGS. 1-3, FIGS. 1-3 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a barrier layer 48, a free layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The barrier layer 48 could be made of insulating material including but not limited to for example oxides such as aluminum oxide (AlO$_x$) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Next, as shown in FIG. 2, one or more etching process is conducted by using the patterned mask 54 as mask to remove part of the cap layers 40, 42, part of the MTJ stack 38, and part of the IMD layer 30 to form a MTJ 62 on the MTJ region 14, in which the first electrode layer 44 at this stage preferably becomes a bottom electrode 76 for the MTJ 62 while the second electrode layer 52 becomes a top electrode 78 for the MTJ 62 and the cap layers 40, 42 could be removed during the etching process. It should be noted that this embodiment preferably conducts a reactive ion etching (ME) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJ 62. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Next, as shown in FIG. 3, a liner 68 is formed on the MTJ 62 to cover the surface of the IMD layer 30. In this embodiment, the liner 68 is preferably made of silicon nitride (SiN), but could also be made of other dielectric material including but not limited to for example silicon oxide, silicon oxynitride, or silicon carbon nitride.

It should be noted that in contrast to reacting silane (SiH$_4$) with ammonia gas (NH$_3$) to form the liner 68 made of SiN in conventional art, the present invention preferably replaces silane with silicon tetrachloride (SiCl$_4$) by reacting SiCl$_4$ with NH$_3$ to form the liner 68 after the MTJ 62 is formed. Since byproduct such as hydrogen gas (H$_2$) produced during the formation of the liner 68 by reacting silane (SiH$_4$) with ammonia gas (NH$_3$) would affect the magnetic property and performance of the MTJ 62, the present invention replaces the conventional approach of using silane with silicon tetrachloride (SiCl$_4$) so that hydrogen chloride (HCl) gas would be produced instead of hydrogen gas. By using the approach it would be desirable to prevent hydrogen gas from influencing the magnetic property of the MTJ 62 underneath.

Figure 4:
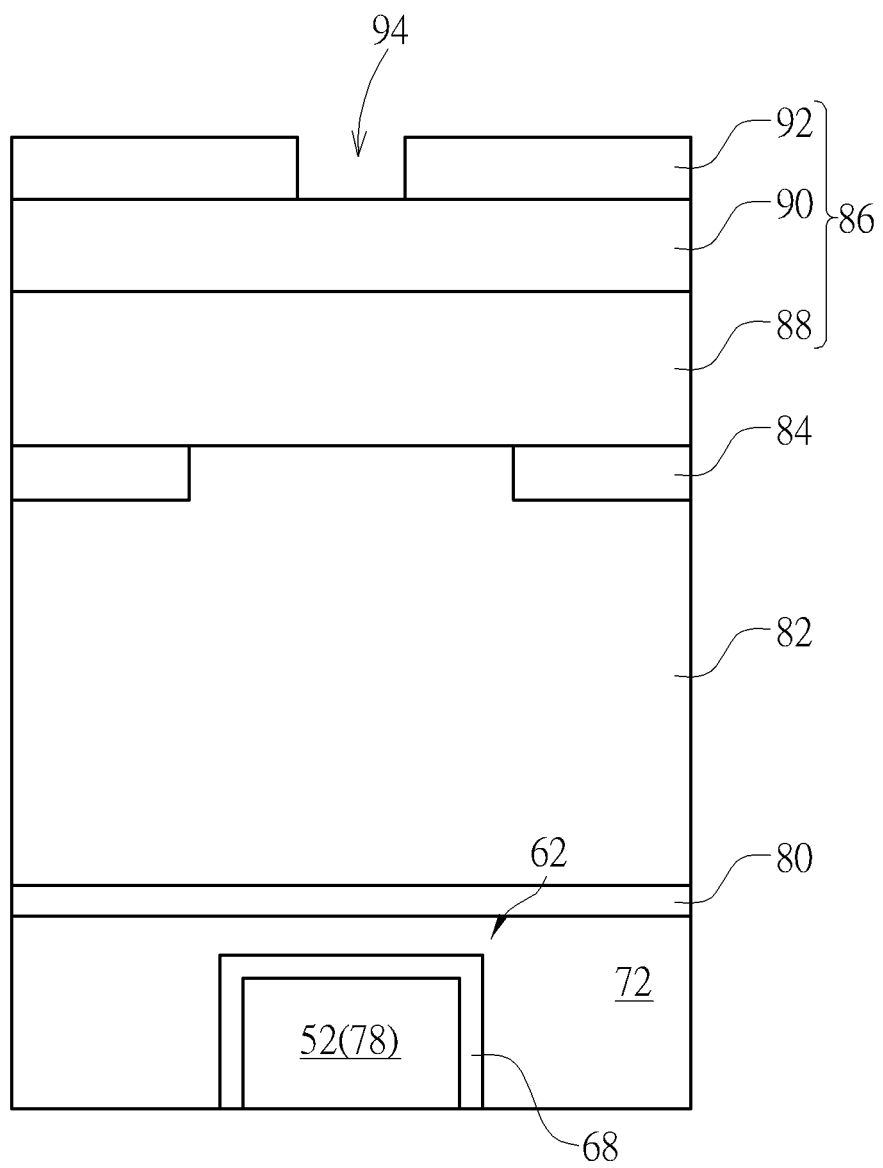

Referring to FIGS. 4-9, FIGS. 4-9 illustrate a method for fabricating a metal interconnection on the MTJ 62 after forming the liner 68 according to an embodiment of the present invention. It should be noted that to emphasize the structural detail of the metal interconnection, only part of the tip portion of the MTJ 62 from FIG. 3 is illustrated in FIGS. 4-9. As shown in FIG. 4, another IMD layer 72 is first formed on the MTJ region 14 and logic region 16 to cover the MTJ 62, and an etch stop layer 80 is formed on the surface of the IMD layer 72, an IMD layer 82 is formed on the etch stop layer 80, a patterned hard mask 84 is embedded in the IMD layer 82, and a patterned hard mask 86 is formed on both the patterned hard mask 84 and IMD layer 82. In this embodiment, the patterned hard mask 86 could include an organic dielectric layer (ODL) 88, a silicon-containing hard mask bottom anti-reflective coating (SHB) 90, and a patterned resist 92, in which the patterned resist 92 includes an opening 94 exposing part of the SHB 90. In this embodiment, the etch stop layer 80 preferably includes nitrogen doped carbide (NDC), the IMD layer 82 preferably includes an ultra low-k (ULK) dielectric layer including but not limited to for example porous material or silicon oxycarbide (SiOC), and the patterned hard mask 84 preferably includes titanium nitride (TiN).

Figure 5:
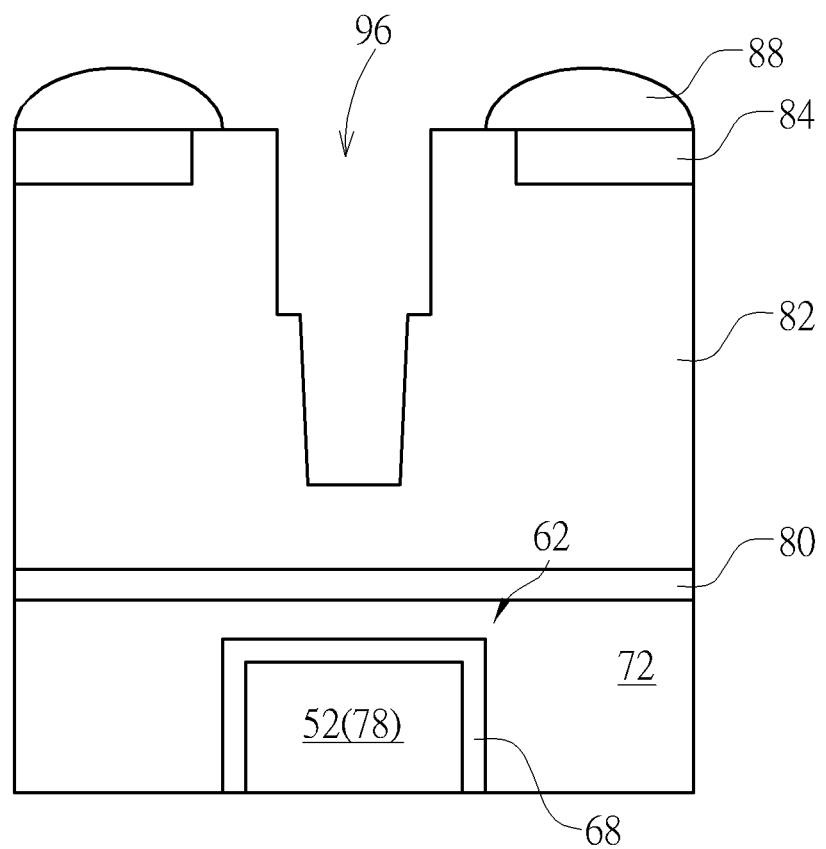

Next, as shown in FIG. 5, an etching process is conducted by using the patterned resist 92 as mask to transfer the opening 94 from the patterned resist 92 to the SHB 90, ODL 88, and IMD layer 82 underneath and at the same time forming a contact hole 96. It should be noted that after the pattern of the opening 94 is transferred to the IMD layer 82, it would be desirable to remove or consume all of the remaining patterned resist 92, all of the SHB 90, and part of the ODL 88 so that a portion of the ODL 88 would remain on the surface of the patterned hard mask 84. In this embodiment, the etching process conducted at this stage preferably includes octafluorocyclobutane ($C_4F_8$) as a main component in the etching gas for removing part of the IMD layer 82 to form the contact hole 96.

Figure 6:
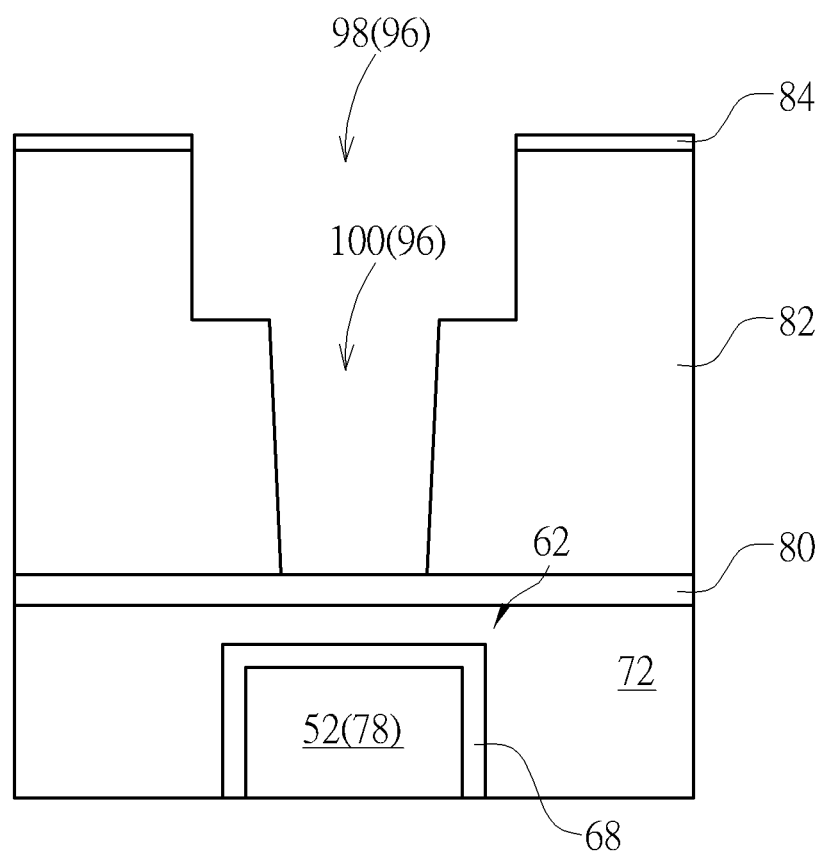

Next, as shown in FIG. 6, an etching process is conducted by using carbon tetrafluoride ($CF_4$) as main etching component to remove the remaining ODL 88, part of the patterned hard mask 84, and part of the IMD layer 82 for expanding the contact hole 96 and at the same time forming a trench opening 98 having greater with and a via opening 100 having lesser width. Preferably, the etching process conducted at this stage exposes the surface of the etch stop layer 80 during the formation of the trench opening 98 and via opening 100 but not removing any of the etch stop layer 80.

Figure 7:
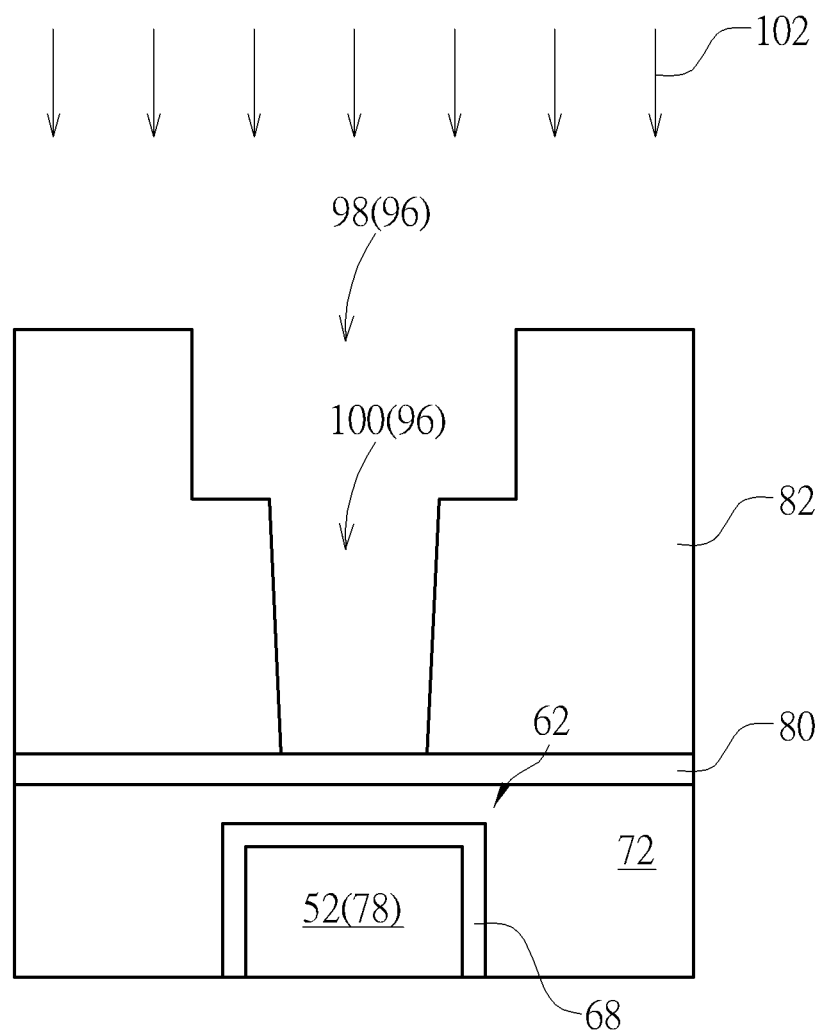

Next, as shown in FIG. 7, a wet clean process 102 is conducted to remove the remaining patterned hard mask 84 completely, and then a treatment process is conducted to remove byproducts thereafter. Specifically, the cleaning process conducted at this stage includes two steps or two stages, in which the wet clean process 102 from the first stage preferably uses hydrogen peroxide ($H_2O_2$) to remove the patterned hard mask 84 without removing any of the etch stop layer 80, and then a dry treatment process from the second stage preferably uses nitrogen gas ($N_2$) or any other gas content not including hydrogen gas to remove byproducts generated during the cleaning process. It should be noted that even though a wet clean process 102 is conducted along with a dry treatment process to strip the patterned hard mask 84, according to other embodiment of the present invention, it would also be desirable to only conduct the wet clean process 102 to remove the patterned hard mask 84 and omit the dry treatment process conducted afterwards, which is also within the scope of the present invention.

Figure 8:
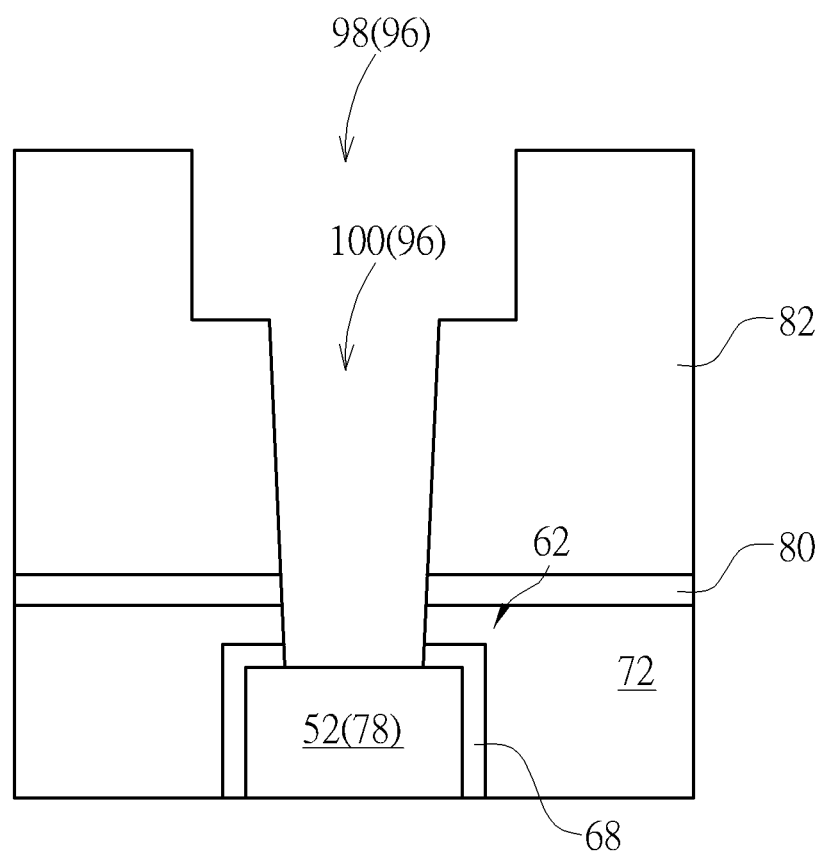

Next, as shown in FIG. 8, another etching process is conducted without forming additional patterned mask by using carbon tetrafluoride ($CF_4$) as main etching component to remove part of the etch stop layer 80, part of the IMD layer 72, and part of the liner 68 and expose the MTJ 62 or top electrode 78 underneath. It should be noted that even though part of the etch stop layer 80 is removed to expose the MTJ 62 after the wet clean process 102 and dry treatment process are completed in FIG. 8, according to another embodiment of the present invention, it would also be desirable to remove part of the etch stop layer 80, part of the IMD layer 72, and part of the liner 68 to expose the MTJ 62 right after $CF_4$ is used to remove the remaining ODL 88, part of the patterned hard mask 84, and part of the IMD layer 82 as conducted in FIG. 6, and then a wet clean process 102 and dry treatment process as disclosed in FIG. 7 are conducted to remove the remaining patterned hard mask 84, which is also within the scope of the present invention.

Figure 9:
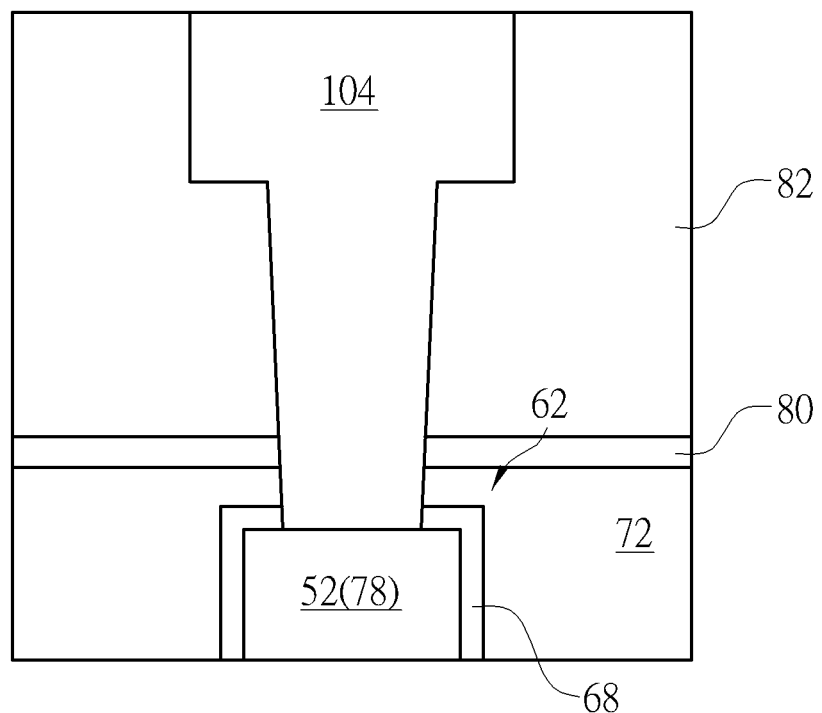

Next, as shown in FIG. 9, metals including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact hole 96, and a planarizing process such as chemical mechanical polishing (CMP) process could be conducted to remove part of the metals including the aforementioned barrier layer and metal layer to form a contact plug or metal interconnection 104 in the contact hole electrically connecting the MTJ 62.

Figure 10:
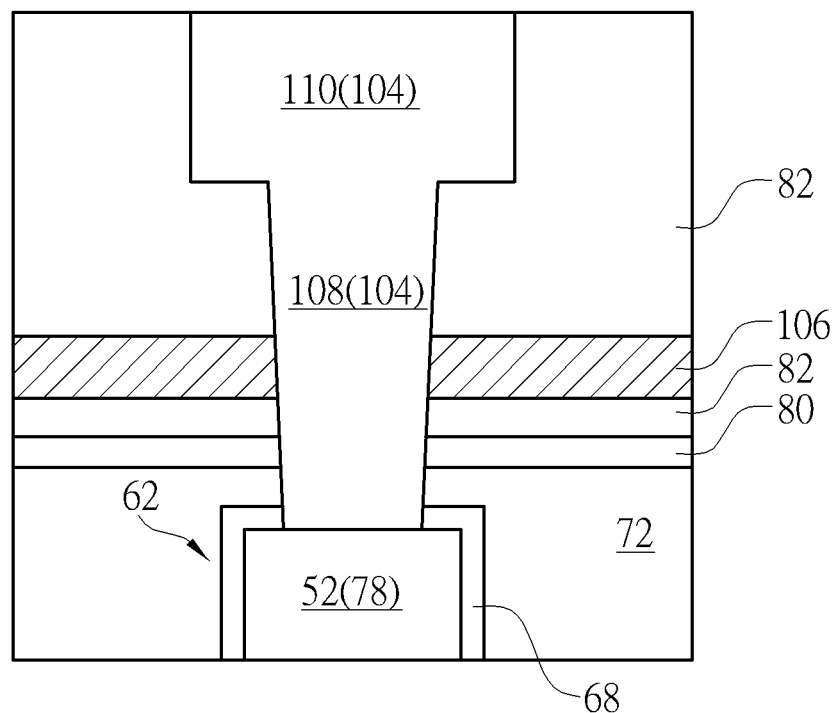
FIG. 10 illustrates a structural view of a semiconductor device according to an embodiment of the present invention.

Referring to FIG. 10, FIG. 10 illustrates a structural view of a semiconductor device according to an embodiment of the present invention. As shown in FIG. 10, it would be desirable to insert a metal oxide layer 106 within the IMD layer 82 as the IMD layer 82 is formed on the surface of the etch stop layer 80 as shown in FIG. 4, and then follow the processes from FIGS. 5-9 to conduct a series of etching and cleaning process to form contact hole 96 in the IMD layer 82 and metal oxide layer 106, and then depositing metals into the contact hole 96 to form a metal interconnection 104. Typically, a forming gas containing hydrogen gas and/or nitrogen gas mixture is injected to repair dangling bonds within the device after the metal interconnection 104 is formed. Since hydrogen gas from the forming gas often affects magnetic property of the MTJ 62, the present invention preferably inserts a metal oxide layer 106 made of aluminum oxide ($Al_2O_3$) within the IMD layer 82 to serve as a barrier layer for preventing hydrogen gas from affecting the MTJ 62 underneath.

Structurally, the semiconductor device shown in FIG. 10 preferably includes a MTJ 62 disposed on the substrate 12, an IMD layer 72 around the MTJ 62, a metal interconnection 104 disposed on the MTJ 62, an IMD layer 82 disposed on the IMD layer 72 and around the metal interconnection 104, an etch stop layer 80 disposed between the IMD layer 72 and IMD layer 82, and a metal oxide layer 106 disposed within the IMD layer 82 and surrounding the metal interconnection 104, in which top surfaces of the IMD layer 82 and the metal interconnection 104 are coplanar. Viewing from a more detailed perspective, the metal interconnection 104 preferably includes a via conductor 108 and a trench conductor 110, in which the via conductor 108 is surrounded by the IMD layer 72, the etch stop layer 80, the IMD layer 82, and the metal oxide layer 106 while the trench conductor 110 is only surrounded by the IMD layer 82.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a magnetic tunneling junction (MTJ) on a substrate;
   forming a first inter-metal dielectric (IMD) layer around the MTJ;
   forming an etch stop layer on the first IMD layer;
   forming a second IMD layer on the etch stop layer;
   forming a patterned hard mask on the second IMD layer;
   performing a first etching process to remove part of the patterned hard mask for forming a contact hole in the second IMD layer and exposing the etch stop layer;
   performing a second etching process to remove the remaining patterned hard mask;
   performing a third etching process to remove the etch stop layer and the first IMD layer for exposing the MTJ; and
   forming a metal interconnection in the contact hole after removing the remaining patterned hard mask.

2. The method of claim 1, further comprising:
   forming a patterned mask on the patterned hard mask; and
   performing the first etching process to remove part of the second IMD layer to form the contact hole, wherein the contact hole comprises a trench opening and the via opening.

3. The method of claim 1, wherein the patterned hard mask comprises titanium nitride (TiN).

4. The method of claim 1, wherein the second etching process comprises:

performing a wet clean process to remove the patterned hard mask; and performing a treatment process to remove byproducts after the wet clean process.

5. The method of claim 4, wherein the wet clean process comprises using hydrogen peroxide ($H_2O_2$) to remove the patterned hard mask.

6. The method of claim 4, wherein the treatment process comprises using nitrogen gas ($N_2$) to remove byproducts after the wet clean process.

7. The method of claim 1, wherein the third etching process comprises using carbon tetrafluoride ($CF_4$) to remove the etch stop layer and the first IMD layer for exposing the MTJ.

8. The method of claim 1, further comprising forming a metal oxide layer in the second IMD layer before forming the contact hole.

9. The method of claim 8, wherein the metal oxide layer comprises $Al_2O_3$.

10. The method of claim 1, further comprising forming a liner adjacent to the MTJ before forming the first IMD layer.

11. The method of claim 10, further comprising reacting silicon tetrafluoride ($SiCl_4$) with ammonia gas ($NH_3$) to form the liner.

\* \* \* \* \*